US008552517B1

(12) United States Patent
Selli et al.

(10) Patent No.: US 8,552,517 B1
(45) Date of Patent: Oct. 8, 2013

(54) CONDUCTIVE PASTE AND MOLD FOR ELECTRICAL CONNECTION OF PHOTOVOLTAIC DIE TO SUBSTRATE

(75) Inventors: Giuseppe Selli, Chandler, AZ (US); Michael DeVita, Chandler, AZ (US); Bob Shih-Wei Kuo, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 457 days.

(21) Appl. No.: 12/881,905

(22) Filed: Sep. 14, 2010

(51) Int. Cl.
*H01L 31/00* (2006.01)

(52) U.S. Cl.
USPC .......................................................... 257/433

(58) Field of Classification Search
USPC .......................................................... 257/433
See application file for complete search history.

(56) References Cited

U.S. PATENT DOCUMENTS

| | | | |
|---|---|---|---|
| 5,622,873 A | 4/1997 | Kim et al. | |
| 5,691,568 A * | 11/1997 | Chou et al. | 257/691 |
| 6,005,287 A | 12/1999 | Kaiya et al. | |
| 6,040,626 A | 3/2000 | Cheah et al. | |
| 6,104,021 A * | 8/2000 | Ogawa | 250/208.1 |
| 6,521,987 B1 * | 2/2003 | Glenn et al. | 257/684 |
| 6,650,004 B1 | 11/2003 | Horie | |
| 6,794,740 B1 | 9/2004 | Edwards | |
| 6,815,244 B2 | 11/2004 | Böttner et al. | |
| 6,844,615 B1 | 1/2005 | Edwards | |
| 6,879,034 B1 * | 4/2005 | Yang et al. | 257/700 |
| 6,888,209 B2 * | 5/2005 | Jobetto | 257/459 |
| 7,002,241 B1 | 2/2006 | Mostafazadeh | |
| 7,235,430 B2 * | 6/2007 | Romano et al. | 438/122 |
| 7,382,056 B2 * | 6/2008 | Chiu et al. | 257/777 |
| 7,417,220 B2 * | 8/2008 | Suehiro et al. | 250/239 |
| 7,528,477 B2 * | 5/2009 | Jeung et al. | 257/690 |
| 7,714,434 B2 * | 5/2010 | Terui et al. | 257/724 |
| 7,791,014 B2 * | 9/2010 | Camargo et al. | 250/239 |
| 8,324,653 B1 * | 12/2012 | Lin et al. | 257/99 |
| 2004/0140549 A1 * | 7/2004 | Miyagawa | 257/700 |
| 2004/0245530 A1 * | 12/2004 | Kameyama et al. | 257/80 |
| 2005/0139969 A1 * | 6/2005 | Lee et al. | 257/672 |
| 2005/0211993 A1 * | 9/2005 | Sano et al. | 257/79 |
| 2008/0284003 A1 * | 11/2008 | Kwang et al. | 257/724 |
| 2010/0065858 A1 * | 3/2010 | Sugiura | 257/81 |
| 2010/0283137 A1 * | 11/2010 | Hsieh et al. | 257/676 |
| 2011/0108113 A1 * | 5/2011 | Arikawa | 136/259 |
| 2011/0140251 A1 * | 6/2011 | Camacho et al. | 257/676 |
| 2011/0248287 A1 * | 10/2011 | Yuan et al. | 257/88 |
| 2011/0260316 A1 * | 10/2011 | Jang et al. | 257/737 |
| 2011/0278712 A1 * | 11/2011 | Hu et al. | 257/686 |
| 2011/0316132 A1 * | 12/2011 | Pagaila et al. | 257/676 |

* cited by examiner

*Primary Examiner* — Thao P. Le

(57) ABSTRACT

In accordance with the present invention, there is provided a CPV module wherein a solder paste is used as an alternative to wire bonds or braided ribbon/mesh connectors to facilitate the electrical connectivity between the concentrated photovoltaic receiver cell or die of the CPV module and the conductive pattern of the underlying substrate thereof. In accordance with the present invention, the possibility of accidentally shorting the top of the receiver die with the other metal parts of the CPV module is avoided by molding at least the periphery of the receiver die with a mold body, and then dispensing or printing the conductive paste between the top of the receiver die and the substrate, the mold body defining a reservoir which facilities the flow of the conductive paste in a prescribed pattern.

20 Claims, 4 Drawing Sheets

CONDUCTIVE PASTE AND MOLD FOR ELECTRICAL CONNECTION OF PHOTOVOLTAIC DIE TO SUBSTRATE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices and, more particularly, to a concentrated photovoltaic (CPV) receiver package or module wherein a conductive paste is used as an alternative to wire bonds or braided ribbon/mesh connectors to facilitate the electrical connectivity between the photovoltaic die of the module and the conductive pattern of the underlying substrate thereof.

2. Description of the Related Art

Photovoltaic cells or dies are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent. Currently known photovoltaic cells typically have a generally quadrangular (e.g., square) configuration defining four peripheral side edges, and include a pair of bus bars which are disposed on the top or front surface and extend along respective ones of an opposed pair of the side edges. The bus bars are used to facilitate the electrical connection of the photovoltaic cell to another structure, as described in more detail below.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a CPV receiver cell or die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration as indicated above. More particularly, the pair of punched thin metal foils or braided ribbon/mesh connectors are welded or soldered to respective ones of the bus bars on the top or front surface of the receiver die. In certain existing CPV modules, the electrical connection of the receiver die to the conductive pattern is facilitated by the use of multiple wires bonded to the bus bars on the front surface of the receiver die and the bond pads of the conductive pattern of the substrate, the wires being used as an alternative to the aforementioned braided ribbon or mesh interconnects. These wire bonds are often fabricated from gold, and are provided in differing numbers and/or diameters depending on the design of the CPV module. The CPV module may further include a light concentration means which is adapted to concentrate solar radiation onto the front surface of the receiver die.

Current CPV receiver die packages or modules typically generate up to ten amps of electrical current. In order to carry such high current, the above-described ribbons made of metal foil or braided wire mesh, or the above-described multiple bond wire bonds are used to form the interconnection between the bus bars on the front surface of the receiver die and the bond pads of the conductive pattern on the substrate. However, the use of the ribbon/mesh type interconnects or, alternatively, the bond wires give rise to certain deficiencies in currently known CPV modules which detract from their overall utility. More particularly, the ribbon/mesh type interconnects do not have good shape control for automatic pick up, and require the use of specialized welding equipment for the fabrication of the CPV module using the same. Stated another way, it is often difficult to control the shape of the ribbon/mesh type interconnects for automatic pick up and placement, with the fabrication process being mostly done through the use of special welding equipment or manual soldering which is more labor intensive and thus more costly. When bond wires are used as an alternative to the ribbon/mesh type interconnects, problems may arise in relation to current crowding if too few wires are used. Moreover, the use of bond wires (as well as the use of the soldered or welded ribbon/mesh interconnects) often gives rise to concerns regarding the electrical current carrying capability of the CPV module including the same.

The present invention addresses these and other shortcomings of prior art CPV modules by providing a CPV module wherein a conductive paste is used as an alternative to wire bonds or braided ribbon/mesh connectors to facilitate the electrical connectivity between the concentrated photovoltaic receiver cell or die of the CPV module and the conductive pattern of the underlying substrate thereof. In accordance with the present invention, the possibility of accidentally shorting the top of the receiver die with the other metal parts of the CPV module is avoided by molding at least the periphery of the receiver die with a mold body, and then dispensing or printing the conductive paste between the top of the receiver die and the substrate, the mold body defining a reservoir which facilities the flow of the conductive paste in a prescribed pattern. These and other features of the present invention will be described in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
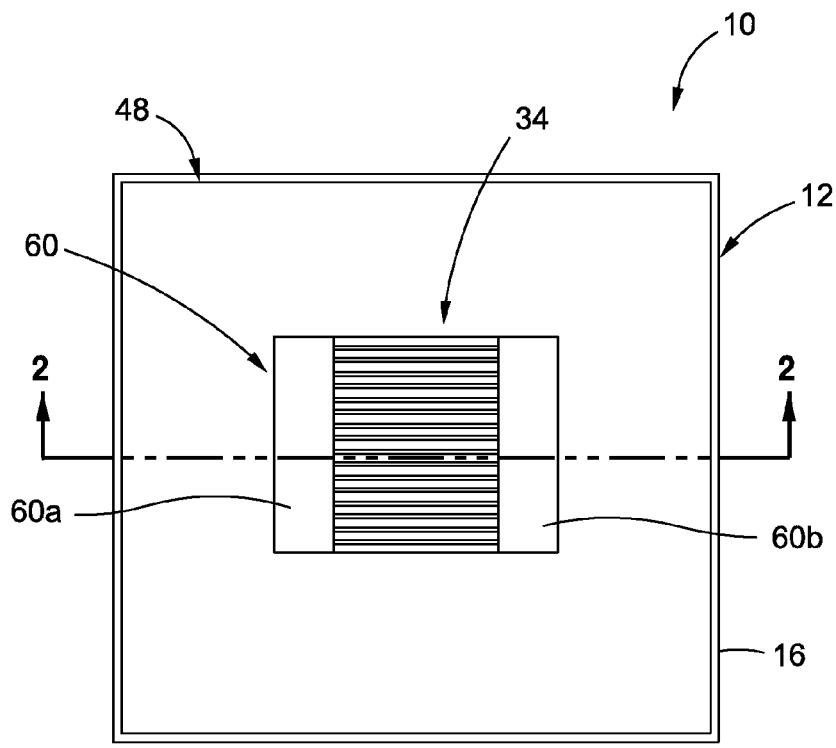
FIG. 1 is a top plan view of a CPV module constructed in accordance with the present invention.
Figure 2:
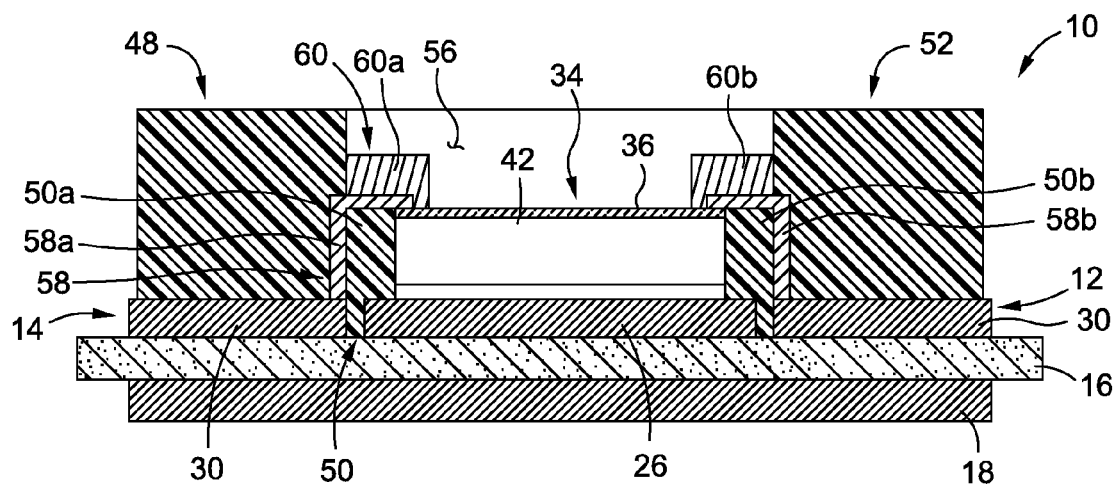
FIG. 2 is a cross-sectional view taken along line 2-2 of FIG. 1.

Referring now to the drawings wherein the showings are for purposes of illustrating a preferred embodiment of the present invention only, and not for purposes of limiting the same, FIGS. 1-8 depict a concentrated photovoltaic (CPV) package or module 10 constructed in accordance with the present invention. In FIGS. 1 and 2, the CPV module 10 is depicted in its fully fabricated state. In FIGS. 3-8, the CPV module 10 is depicted in partially completed states of fabrication, with an initial fabrication stage being shown in FIGS. 3 and 4, an intermediate fabrication stage being shown in FIGS. 5 and 6, and an intermediate fabrication stage just prior to completion being shown in FIGS. 7 and 8.

Figure 3:
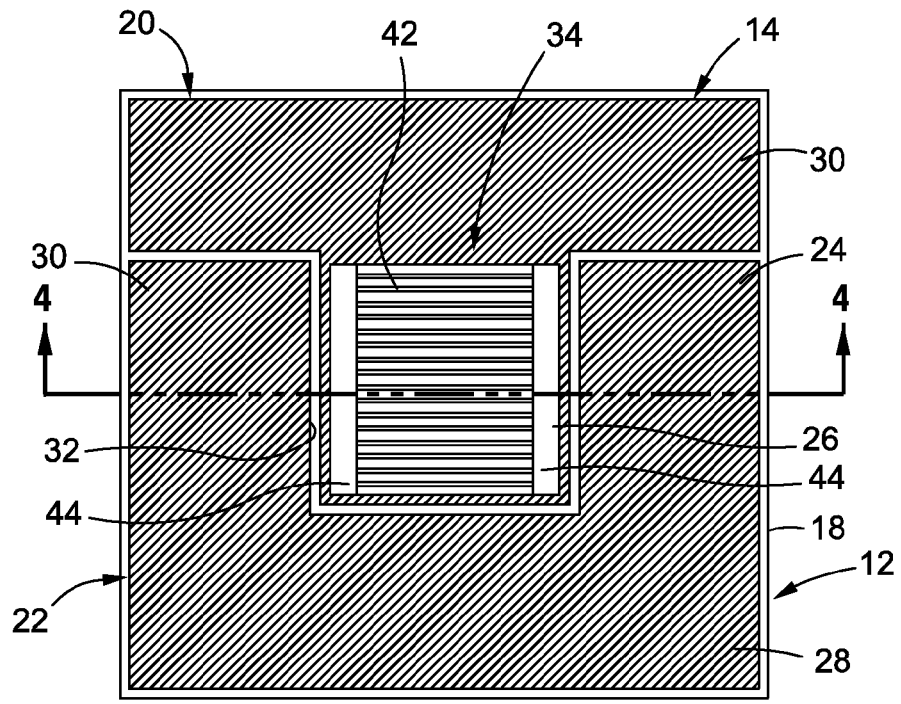
FIG. 3 is a top plan view of the CPV module of the present invention in an initial state of fabrication prior to the formation of the mold body thereof.
Figure 4:
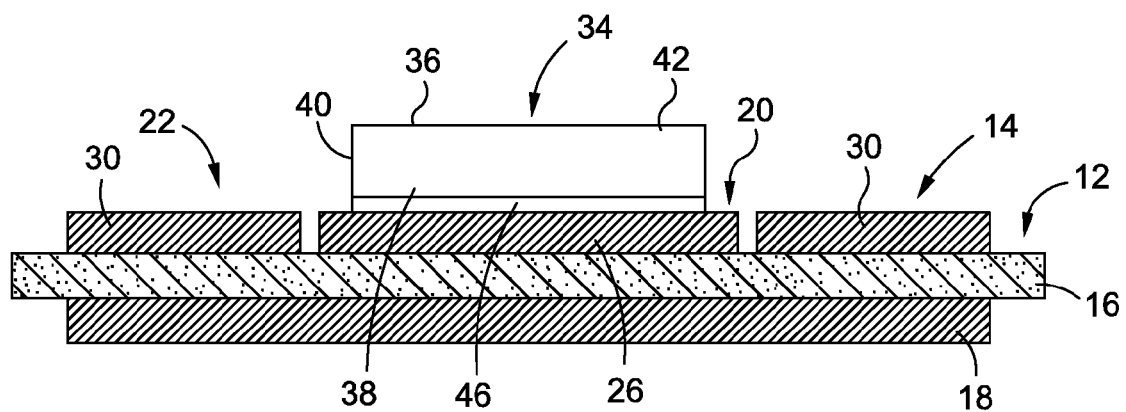
FIG. 4 is a cross-sectional view taken along line 4-4 of FIG. 3.

As is most easily seen in FIGS. 3 and 4, the CPV module 10 comprises a substrate 12 which has a generally quadrangular (e.g., square) configuration. When viewed from the perspective shown in FIG. 4, the substrate 12 comprises a first (top) layer 14 which is preferably fabricated from copper, a second (middle) layer 16 which is preferably fabricated from a ceramic material, and a third (bottom) layer 18 which, like the first layer 14, is also preferably fabricated from copper. As is apparent from FIGS. 3 and 4, the second layer 16 is sized relative to the first and third layers 14, 18 such that the peripheral edge of the second layer 18 protrudes beyond those defined by each of the first and third layers 14, 18.

As best seen in FIG. 3, the first layer 14 of the substrate 12 is not a continuous, unitary structure. Rather, the first layer 14 includes a first section 20 and a separate second section 22. The first section 20 includes a generally rectangular base portion 24 which defines opposed pairs of longitudinally and laterally extending side edges. In addition to the base portion 24, the first section 20 includes a generally square die pad portion 26 which protrudes from one of the longitudinally extending side edges of the base portion 24.

The second section 22 of the first layer 14 includes a generally rectangular base portion 28 defining opposed pairs of longitudinally and laterally extending side edges. In addition to the base portion 28, the second section 22 includes an identically configured pair of prong portions 30 which each have a quadrangular configuration, and extend in spaced, generally parallel relation to each other from a common longitudinally extending side edge of the base portion 28. As is further seen in FIG. 3, the base and prong portions 28, 30 of the second section 22 collectively define a generally square gap or recess 32 which is sized and configured to accommodate the die pad portion 26 of the first section 20. More particularly, in the substrate 12, the first and second sections 20, 22 of the first layer 14 are oriented relative to each other such that the die pad portion 26 is disposed within the recess 32. However, the first and second sections 20, 22 are maintained in spaced relation to each other, with a continuous gap or void being defined therebetween as also shown in FIG. 3.

The CPV module 10 constructed in accordance with the present invention further comprises a photovoltaic receiver cell or die 34. The receiver die 34 has a generally quadrangular (e.g., square) configuration, and defines a generally planar top or front surface 36, and an opposed, generally planar bottom or back surface 38. In addition, the receiver die 34 defines four (4) generally straight peripheral side surface segments 40. The receiver die 34 is fabricated from a number of layers, including an active layer 42 which is applied to one side or face of an underlying substrate, and defines the front surface 36 of the receiver die 34. As seen in FIG. 3, the active layer 42 itself includes a pair of elongate contact strips of bus bars 44 which extend in spaced, generally parallel relation to each other along respective ones of an opposed pair of the peripheral side surface segments 40 of the receiver die 34. More particularly, the bus bars 44 extend along those peripheral side surface segments 40 which in turn extend along respective ones of the prong portions 30 of the second section 22 of the first layer 14. As seen in FIG. 4, in the CPV module 10, the back surface 38 of the receiver die 34 is mounted and electrically connected to the top surface of the die pad portion 26 of the first section 20 of the first layer 14. Such mounting and electrical connection is preferably facilitated by the use of a layer 46 of a conductive epoxy which is interposed between the back surface 38 and the die pad portion 26. Thought not shown, the CPV module 10 may further include an electronic device such as a packaged diode or rectifier which is attached to the top surface of the base portion 24 of the first section 20 and electrically connected to one of the prong portions 30 of the second section 22.

In the CPV module 10, the side surface segments 40 and portions of the first and second sections 20, 22 of the first layer 14 of the substrate 12 are covered by an encapsulant material which, upon hardening, defines a mold body 48 of the CPV module 10. The mold body 48 has a generally quadrangular (e.g., square) configuration and, as shown in FIGS. 1, 2 and 5-8, is formed so as to cover the entirety of the top surface of the base portion 24 of the first section 20, and that area of the top surface of the die pad portion 26 of the first section 20 which is not covered by the receiver die 34. In addition, the mold body 48 covers the entirety of the top surface of the base portion 28 of the second section 22, and the majority of the top surfaces of the prong portions 30 of the second section 22. However, as will be described in more detail below, the mold body 48 is formed such that, in an initial stage of the fabrication of the CPV module 10, an elongate, strip-like segment of each of the prong portions 30 is not covered thereby, and thus exposed therein.

Figure 6:
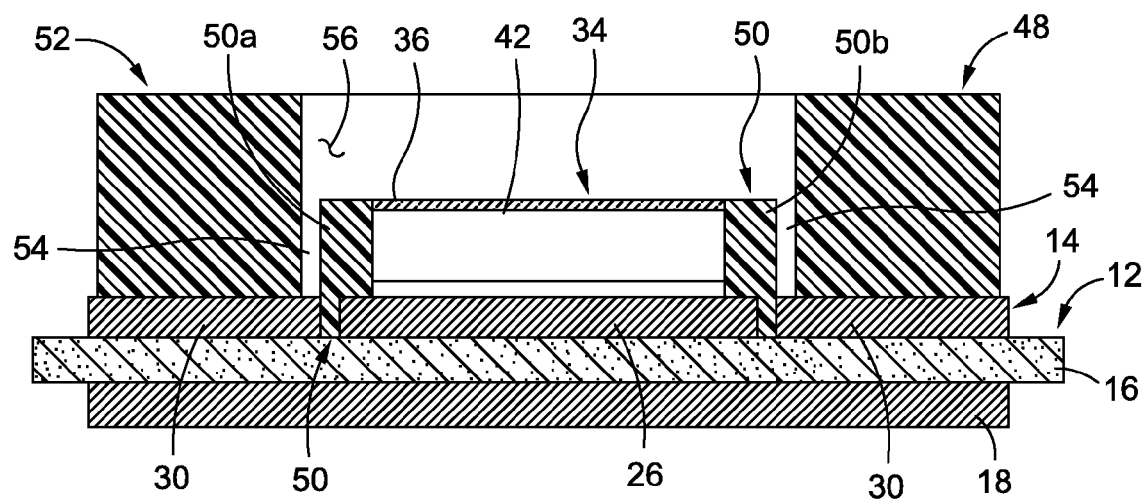
FIG. 6 is a cross-sectional view taken along line 6-6 of FIG. 5.
Figure 8:
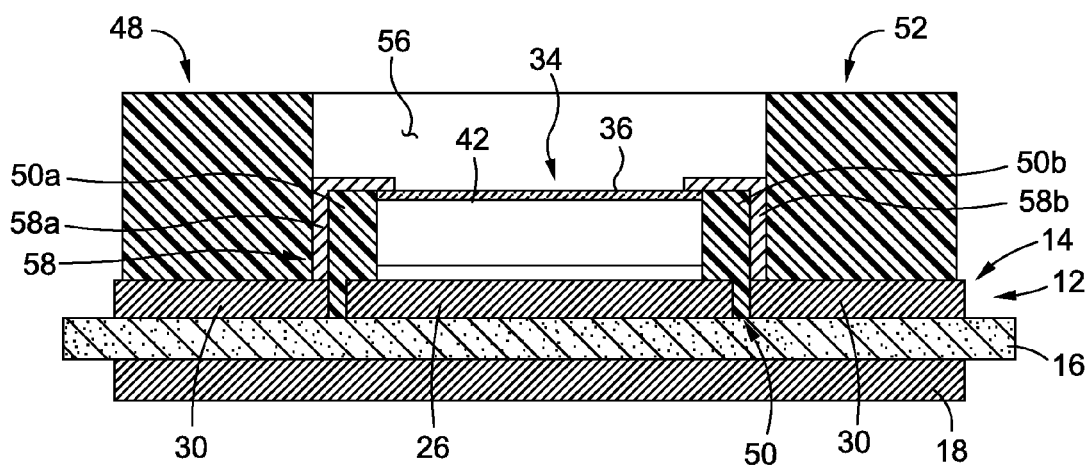
FIG. 8 is a cross-sectional view taken along line 8-8 of FIG. 7.

As is most easily seen in FIGS. 2, 6 and 8, the mold body 48 is not of uniform thickness. In this regard, the mold body 48 includes an inner portion 50 which is of a first thickness, and a peripheral outer portion 52 which is of a second thickness exceeding the first thickness. More particularly, the inner portion 50 comprises two elongate segments 50a, 50b of the mold body 48 which extend along and cover respective ones of those side surface segments 40 of the receiver die 34 which in turn extend along respective ones of the prong portions 30 of the second section 22. As viewed from the perspective shown in FIG. 6, each segment 50a, 50b of the inner portion 50 defines a top surface which extends in generally co-planar relation to the front surface 36 of the receiver die 34. The inner portion 50 also covers those regions of the top surface of the die pad portion 26 which are not covered by the receiver die 34 and extend along those side surface segments 40 of the receiver die 34 also covered by the inner portion 50. As further shown in FIG. 6, the inner portion 50 of the mold body 40 also extends through those gaps defined between the prong portions 30 and the corresponding, adjacent peripheral edge segments of the die pad portion 26, into direct contact with the top surface of the second layer 16 of the substrate 12.

Figure 5:
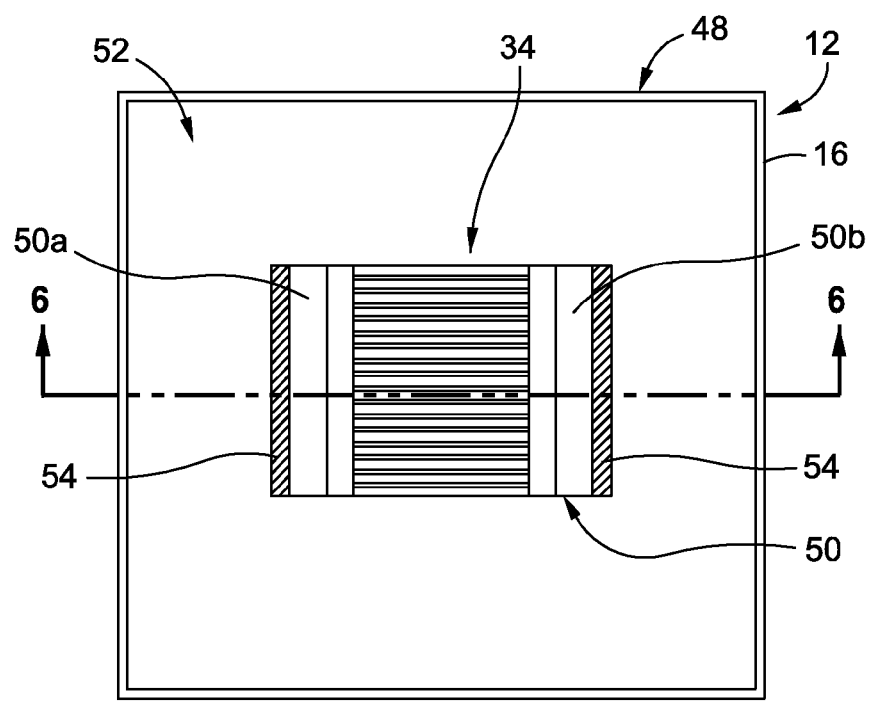
FIG. 5 is a top plan view of the CPV module of the present invention in an intermediate state of fabrication subsequent to the formation of the mold body thereof, but prior to the dispensation or printing of the conductive paste included therein.

As is also apparent from the perspective shown in FIG. 6, the outer portion 52 of the mold body 48 defines a generally planar top surface which is elevated above that defined by the inner portion 50, i.e., the top surfaces of the inner and outer portions 50, 52 extend along respective ones of a spaced, generally parallel pair of planes. Additionally, as shown in FIGS. 5 and 6, the outer portion 52 circumvents the receiver die 34, though the outer portion 52 only contacts and covers that opposed pair of the side surface segments 40 of the receiver die 34 which are not in contact with the segments 50a, 50b of the mold body 48 collectively defining the inner portion 50 thereof. In this regard, the outer portion 52 is separated from each of the two elongate segments 50a, 50b of the mold body 48 defining the inner portion 50 by respective ones of a pair of elongate slots or channels 54. As further seen in FIGS. 5 and 6, each of the channels 54 extends generally perpendicularly between the top surface of one of the segments 50a, 50b of the inner portion 50 and a prescribed section or segment of the top surface of a corresponding one of the prong portions 30. Thus, the aforementioned elongate segments of the top surfaces of the prong portions 30 which are not covered by the mold body 48 are exposed within respective ones of the channels 54 defined by the mold body 48.

Though not apparent from FIGS. 2, 6 and 8, the outer portion 52 of the mold body 48 extends through the gap defined between the base portion 28 of the second section 22 and the adjacent peripheral edge segment of the die pad portion 26 defined by the distal end thereof, and into contact with the top surface of the second layer 16 of the substrate 12. The outer portion 52 of the mold body 48 also extends into and through the gaps defined between the distal ends of the prong portions 30 of the second section 22 and the base portion 24 of the first section 20, into contact with the top surface of the second layer 16 of the substrate 12.

Based on the structural features of the mold body 48 described above, such mold body 48 defines a centrally oriented, generally quadrangular reservoir 56. The reservoir 56 is circumvented by the top surface of the outer portion 52 of the mold body 48. Additionally, when viewed from the perspective shown in FIGS. 2, 6 and 8, the bottom surface of the reservoir 56 is collectively defined by the front surface 36 of the receiver die 34 and the top surface of the inner portion 50 of the mold body 48 (i.e., the top surfaces of the segments 50a, 50b). The side surfaces or side walls of the reservoir 56 are defined by inner surface segments of the outer portion 52 of the mold body 48. The aforementioned channels 54 thus extend from the bottom surface of the reservoir 56 to prescribed segments of the top surfaces of respective ones of the prong portions 30 in the above-described manner.

Figure 7:
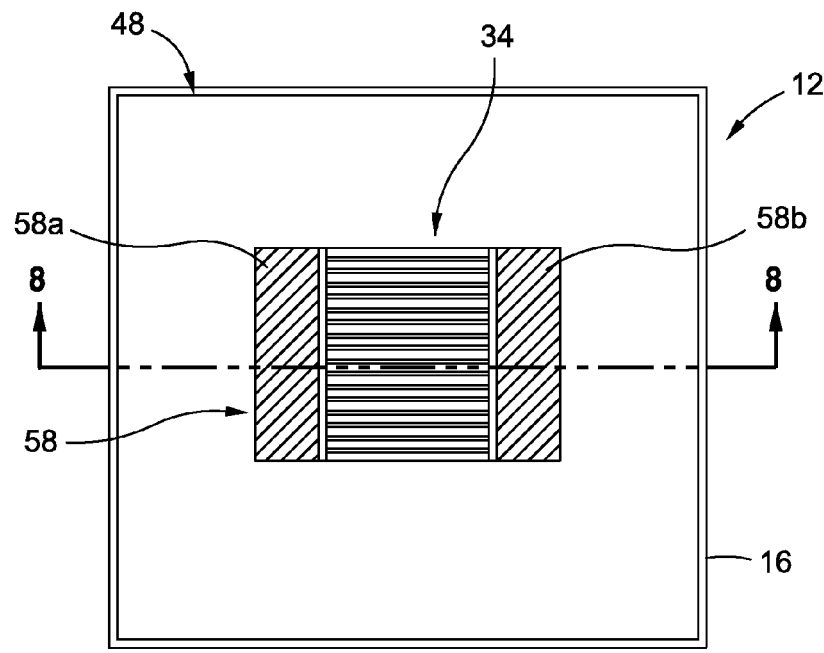
FIG. 7 is a top plan view of the CPV module of the present invention in an intermediate state of fabrication subsequent to the dispensation or printing of the conductive paste included therein but prior to the dispensation of the protective encapsulant thereof.

Referring now to FIGS. 7 and 8, in the CPV module 10, a conductive paste 58 is dispensed or printed into each of the channels 54 so as to completely fill the channels 54, the conductive paste 58 thus coming into direct contact with the elongate segments of the prong portions 30 of the second section 22 originally exposed in the channels 54. The conductive paste 58 is also dispensed or printed so as to flow over and thus cover the top surface of the inner portion 50 of the mold body 48, and more particularly the top surfaces of the two elongate segments 50a, 50b of the mold body 48 defining the inner portion 50. As further seen in FIG. 8, the conductive paste 58 is also dispensed or printed so as to flow over and make electrical contact with the bus bars 44 of the receiver die 34.

More particularly, the conductive paste 58 is segregated into two separate and distinct segments 58a, 58b. In this regard, each segment 58a, 58b of the conductive paste 58 extends between and is electrically connected to one of the bus bars 44 of the receiver die 34, that prong portion 30 disposed closest to such bus bar 44, and the top surface of that segment 50a, 50b of the inner portion 50 which extends between the bus bar 44 and corresponding prong portion 30, as shown in FIG. 8. As will be recognized, in the CPV module 10, the separate segments 58a, 58b of the conductive paste 58 are used as an alternative to the bond wires or braided ribbon/mesh connectors described above to facilitate the electrical connection of each of the bus bars 44 of the receiver die 34 to respective ones of the prong portions 30 of the second section 22 of the first layer 14 included in the substrate 12. Though being of relatively low viscosity, the conductive paste 58, when initially dispensed or printed into the reservoir 56, is prevented from outflow over the mold body 48 by the outer portion 52 thereof, and in particular the aforementioned inner surface segments of the outer portion 52. Those of ordinary skill in the art will recognize that other conductive materials, such as a metallic paste (e.g., solder or copper paste), may be substituted for the conductive paste 58 without departing from the spirit and scope of the present invention.

Referring now to FIGS. 1 and 2, of the CPV module 10 of the present invention further comprises an encapsulant layer 60 which is applied to those portions of each of the two segments 58a, 58b of the conductive paste 58 which are exposed in the reservoir 56 prior to the formation of the encapsulant layer 60. In the CPV module 10, the encapsulant layer 60 is preferably segregated into two elongate strips 60a, 60b, each such strip 60a, 60b of the encapsulant layer 60 being applied to and covering the exposed portion of a respective one of the segments 58a, 58b of the conductive paste 58. Thus, as seen in FIG. 2, small areas of each segment 60a, 60b of the encapsulant layer 60 come into contact with the front surface 36 of the receiver die 34. Additionally, each of the strips 60a, 60b extends between an opposed pair of the inner surface segments of the outer portion 52 which partially define the reservoir 56.

In the CPV module 10, it is contemplated that reservoir 56 of the mold body 48, and in particular the inner surface segments of the outer portion 52 which partially define the same, may be mechanically adapted to facilitate the alignment of a light concentrating device such as an optical light guide or prism with the front surface 36 of the receiver die 34 exposed in the reservoir 56. The alignment function may be assisted by one or both of the strips 60a, 60b residing within the reservoir 56.

An exemplary sequence of steps to facilitate the fabrication of the CPV module 10 may comprise the initial step of providing the substrate 12 having the above-described structural attributes, and thereafter attaching the receiver die 34 thereto in the above-described manner, and in accordance with the showings in FIGS. 3 and 4. In the next step of the fabrication method, the mold body 48 having the aforementioned structural attributes may be formed on the substrate 12 and receiver die 34 in the above-described manner, and in accordance with the showings in FIGS. 5 and 6. The step of forming the mold body 48 may be followed by the dispensation or printing of the conductive paste 58 in the manner also described above and in accordance with the showings in FIGS. 7 and 8. The last step of the fabrication process for the CPV module 10 may comprise forming the encapsulant layer 60 to cover the exposed portions of the conductive paste 58 in the above-described manner and in accordance with the showings in FIGS. 1 and 2, the formation of the encapsulant layer 60 completing the fabrication of the CPV module 10.

Thus, in the CPV module 10 of the present invention, the conductive paste 58 completes the electrical connection of the bus bars 44 of the receiver die 34 to the substrate 12, and in particular the prong portions 30 of the second section 22 thereof. The use of the conductive paste 58 (or other conductive material) as an alternative to bond wires or braided ribbon/mesh connectors ensures low resistivity and hence low voltage drop in the CPV module 10 due to the uniformity and thickness of each segment 58a, 58b of the conductive paste 58. This enhanced electrical performance of the CPV module 10 is realized even though the conductive paste 58 or other conductive material may not be as conductive as gold, copper or other materials typically used to make wire bonds or braided ribbon/connectors. Additionally, the formation of the mold body 48 in the CPV module 10 may be accomplished using readily available molding techniques, thus not excessively increasing the complexity of the manufacturing process for the CPV module 10, or resulting in a substantial increase in the cost associated therewith.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A CPV module, comprising:
a substrate comprising a conductive first section and a conductive second section that are disposed in spaced relation to each other with a gap defined therebetween;
a photovoltaic receiver die having a first surface and a second surface opposite to the first surface, wherein the second surface is mounted and electrically connected to the conductive first section of the substrate;
a mold body comprising:
an inner portion that partially covers the photovoltaic receiver die and disposed within at least a portion of the gap; and
an outer portion that partially covers and circumvents the photovoltaic receiver die, wherein the outer portion is separated from the inner portion by at least one channel laterally spaced apart from the photovoltaic receiver die; and
a conductive material disposed in the at least one channel to electrically connect the first surface of the photovoltaic receiver die to the second section of the substrate.

2. The CPV module of claim 1 wherein the conductive material is a conductive paste.

3. The CPV module of claim 1 further comprising an encapsulant layer that covers any portion of the conductive material that is not in contact with the substrate or the mold body.

4. The CPV module of claim 1 wherein the conductive material covers a top surface of the inner portion of the mold body.

5. The CPV module of claim 1 wherein:
the conductive first section defines a die pad portion having the photovoltaic receiver die mounted and electrically connected thereto;
the conductive second section includes a spaced pair of prong portions that have at least part of the die pad portion extending therebetween and in spaced relation thereto; and
the conductive material is segregated into two segments that are used to electrically connect the photovoltaic receiver die to prescribed regions of respective ones of the prong portions.

6. The CPV module of claim 1 further comprising a bus bar disposed over a portion of the first surface of the photovoltaic receiver die, wherein the conductive material covers a top surface of the inner portion and contacts the bus bar.

7. The CPV module of claim 1 wherein the inner portion is of a first thickness, and the outer portion is of a second thickness that exceeds the first thickness, such that the inner and outer portions collectively define a reservoir in the mold body that has a portion of the photovoltaic receiver die exposed therein.

8. The CPV module of claim 1 wherein:
the inner portion of the mold body defines a top surface that extends along a first plane in generally coplanar relation to the first surface of the photovoltaic receiver die; and
the outer portion of the mold body defines a top surface that extends along a second plane disposed in spaced, generally parallel relation to the first plane.

9. The CPV module of claim 1 wherein:
the photovoltaic receiver die defines a plurality of side surface segments; and
the inner portion comprises a spaced pair of elongated segments that extend along and cover respective ones of an opposed pair of the side surface segments defined by the photovoltaic receiver die.

10. The CPV module of claim 1 wherein:
the substrate further comprises a dielectric second layer having the conductive first and second sections formed thereon; and
the inner and outer portions of the mold body extend through prescribed regions of the gap into contact with the dielectric second layer of the substrate.

11. A CPV module, comprising:
a substrate comprising a conductive layer having first and second sections, the first and second sections disposed in spaced relation to each other with a gap defined therebetween;
a photovoltaic receiver die having a first surface and a second surface opposite to the first surface, wherein the second surface is mounted and electrically connected to the conductive first section of the substrate;
a mold body at least partially covering the substrate and the photovoltaic receiver die and defining a reservoir having a portion of the photovoltaic receiver die exposed therein, the mold body comprising:
an inner portion that partially covers the photovoltaic receiver die and disposed within at least a portion the gap; and
an outer portion separated from the inner portion by a pair of channels each laterally spaced apart from the photovoltaic receiver die and adjoining the conductive second section of the substrate; and
a conductive material further disposed in the pair of channels to electrically connect the first surface of the photovoltaic receiver die to the second section of the substrate.

12. The CPV module of claim 11 wherein the conductive material is a conductive paste.

13. The CPV module of claim 11 further comprising an encapsulant layer that covers any portion of the conductive material that is not in contact with the substrate or the mold body.

14. The CPV module of claim 11 wherein the outer portion is disposed in another portion of the gap.

15. The CPV module of claim 11 wherein:
the first section defines a die pad portion having the photovoltaic receiver die mounted and electrically connected thereto;
the second section includes a spaced pair of prong portions that have at least part of the die pad portion extending therebetween and in spaced relation thereto; and
the conductive material is segregated into two segments that are used to electrically connect the photovoltaic receiver die to prescribed regions of respective ones of the prong portions.

16. The CPV module of claim 11 further comprising a pair of bus bars extending in spaced, generally parallel relation to each other along respective ones of an opposed pair of peripheral side surface segments of the photovoltaic receiver die, and wherein the conductive material covers a top surface of the inner portion and contacts the pair of bus bars.

17. The CPV module of claim 11 wherein the inner portion is of a first thickness, and the outer portion is of a second thickness that exceeds the first thickness, the inner and outer portions and the photovoltaic receiver die collectively defining the reservoir.

18. The CPV module of claim 11 wherein:
the photovoltaic receiver die defines a plurality of side surface segments; and
the inner portion comprises a spaced pair of elongate segments that extend along and cover respective ones of an opposed pair of the side surface segments defined by the photovoltaic receiver die.

19. The CPV module of claim 11 wherein:
the substrate further comprises a dielectric second layer having the conductive first layer formed thereon; and
the inner and outer portions of the mold body extend through prescribed regions of the gap into contact with the dielectric second layer of the substrate.

20. A CPV module, comprising:
a substrate;
a light receiving die having opposing first and second surfaces, the second surface electrically connected to a conductive first section the substrate; and
a mold body that at least partially covers the substrate and accommodates the light receiving die, wherein the mold body comprises:
an inner portion that partially covers the light receiving die; and
an outer portion separated from the inner portion by at least one channel, wherein the at least one channel is laterally spaced apart from the light receiving die and adjoins a conductive second section of the substrate that is electrically isolated from the conductive first section; and
a conductive material disposed in the at least one channel to electrically connect the first surface of the light receiving die to the conductive second section of the substrate.

* * * * *